United States Patent
Masuo

(10) Patent No.: US 6,496,602 B2
(45) Date of Patent: Dec. 17, 2002

(54) SORTING DEVICE OF VARIABLE-LENGTH CODE

(75) Inventor: Shunichi Masuo, Inashiki Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/212,764

(22) Filed: Dec. 16, 1998

(65) Prior Publication Data

US 2002/0057742 A1 May 16, 2002

(30) Foreign Application Priority Data

Dec. 19, 1997 (JP) ............................................. 9-350793

(51) Int. Cl.[7] .............................. G06K 9/36; G06K 9/46
(52) U.S. Cl. .................................. 382/246; 375/240.23
(58) Field of Search ............................... 341/50–67, 76, 341/173, 182, 200; 382/232, 248, 250, 246, 244, 245; 348/405.1; 358/427, 261.1, 261.2, 261.3, 430; 714/779

(56) References Cited

U.S. PATENT DOCUMENTS

| | | | | | |
|---|---|---|---|---|---|
| 4,276,544 A | * | 6/1981 | Iinuma | ........................ | 341/63 |
| 5,557,271 A | * | 9/1996 | Rim et al. | ..................... | 341/67 |
| 5,648,774 A | * | 7/1997 | Hsieh | ........................... | 341/67 |
| 5,675,332 A | * | 10/1997 | Limberg | ...................... | 341/67 |
| 5,905,502 A | * | 5/1999 | Deering | ...................... | 345/420 |
| 5,910,909 A | * | 6/1999 | Purcell et al. | ............... | 708/322 |
| 5,982,306 A | * | 11/1999 | Nam | ........................... | 341/67 |

* cited by examiner

*Primary Examiner*—Timothy M. Johnson
(74) *Attorney, Agent, or Firm*—Bret J. Petersen; W. James Brady; Frederick J. Telecky, Jr.

(57) ABSTRACT

A sorting device for a variable-length code containing the following parts: a coding part 43 that converts the length value to a first bit column according to its value, a first shifter 44 that converts the first bit column input from said coding part 43 to a second bit column according to the shift parameters, a second shifter 42 that converts the code value to a third bit column according to the shift parameter, and a register 45 that has the second bit column input from said first shifter 44 and the third bit column input from said second shifter 42, and which outputs only the content of the bit at the position of the third bit column corresponding to the position of the bit indicating the prescribed value "1" of the second bit column.

4 Claims, 3 Drawing Sheets

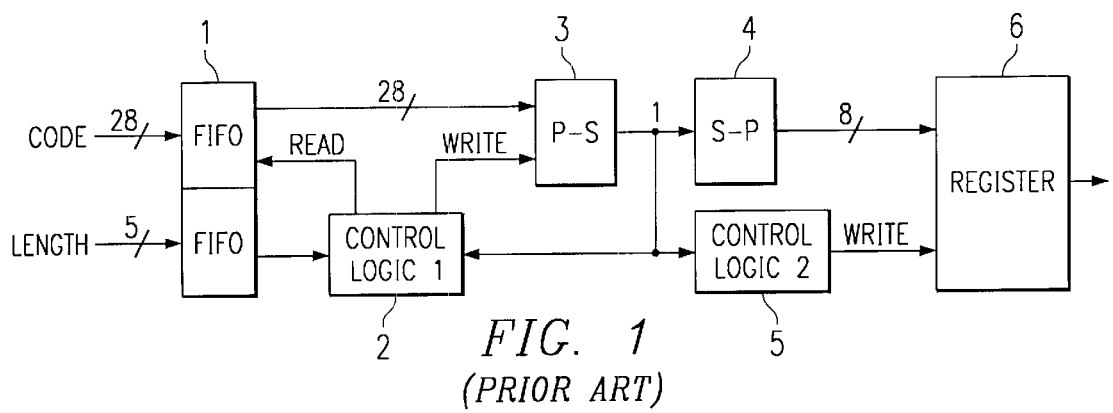
FIG. 1
(PRIOR ART)
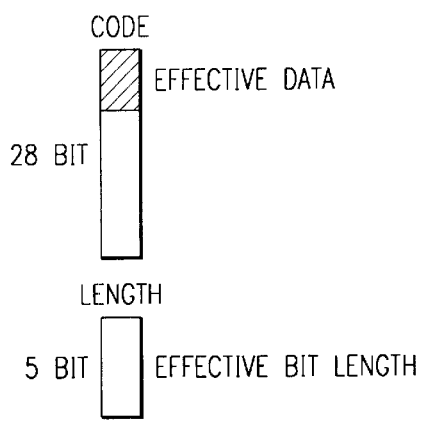
FIG. 2
(PRIOR ART)
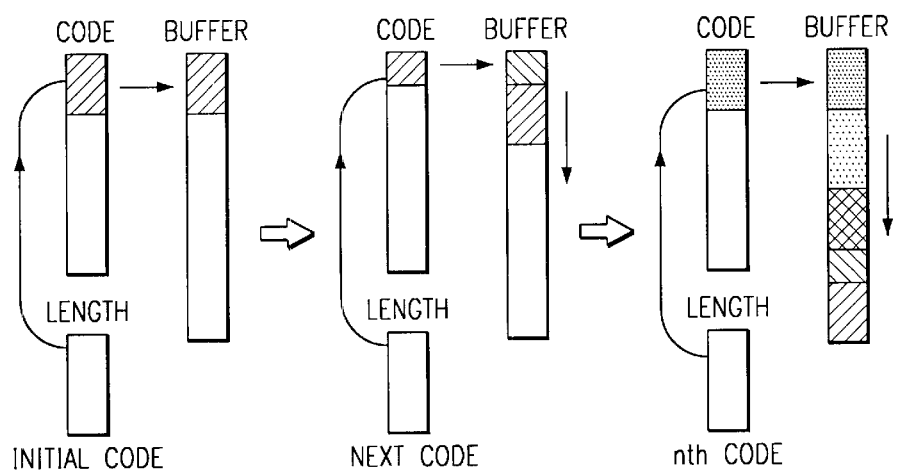
FIG. 3a
(PRIOR ART)
FIG. 3b
(PRIOR ART)
FIG. 3c
(PRIOR ART)

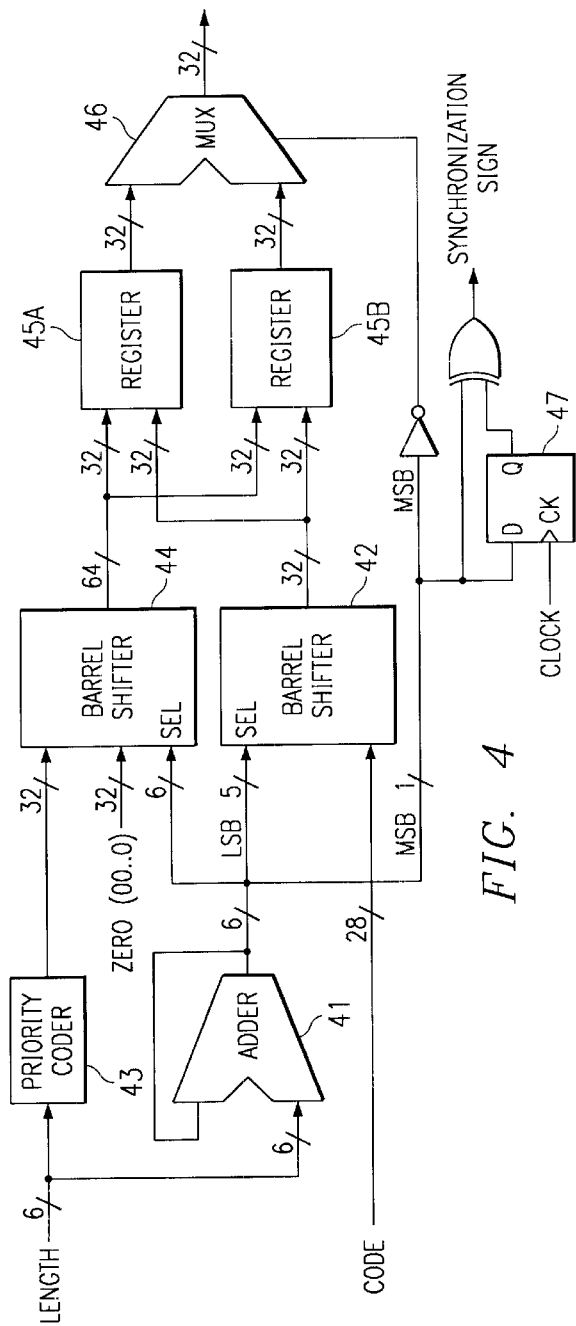
FIG. 4
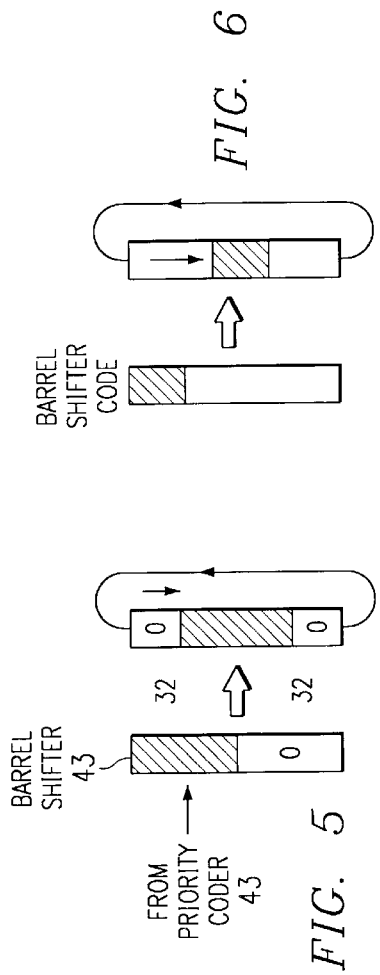
FIG. 5
FIG. 6

SORTING DEVICE OF VARIABLE-LENGTH CODE

FIELD OF THE INVENTION

This invention pertains to a type of processing of the variable-length code based on image signals, etc. In particular, this invention pertains to the sorting of a variable-length code for use in the coding of MPEG.

BACKGROUND OF THE INVENTION

In the MPEG standard, in order to realize high-efficiency coding, the variable-length code is adopted. The variable-length code is adopted for coding at a high efficiency for transmitting the quantized DCT coefficient. By giving shorter codes to symbols having a high probability of generation and longer codes to symbols having a low probability of generation, it is possible to reduce the amount of the data transmitted.

For the prior art pertaining to the output of the variable-length code, as shown in FIG. 1, the serial bit from parallel/serial converting unit 3 to serial/parallel converting unit 4 is taken as an input to control logic unit 2; when it becomes equal to the magnitude of the "length," the next data portion is input from FIFO 1 to parallel/serial converting unit 3. In this case, when it is impossible to perform the processing of parallel/serial converting unit 3 and serial/parallel converting unit 4 more than 28 times faster than the input clock of the code/length, it is naturally necessary to set a buffer such as FIFO 1 in the former stage of parallel/serial converting unit 3. That is, the processing rate of parallel/serial converting unit 3 and serial/parallel converting unit 4 becomes a restriction of the processing rate of the entire system containing them.

According to this invention, sorting of the variable-length code means that, as shown in FIG. 2, the effective data among the 28-bit code (with its length represented by "length") is extracted and packed as shown in FIG. 3, and is output at the time when it becomes a prescribed length. That is, the effective portion of the code is accommodated in a buffer (FIG. 3(a)), the initial code of the buffer corresponding to the length of the next code is shifted, and the code is accommodated in the buffer (FIG. 3(b)); this operation is repeated until the buffer becomes full and is output (FIG. 3(c)). In the sorting, the code is moved one bit at a time to the buffer and, at the same time, it is shifted one bit by one bit in the buffer. An improvement is demanded from the viewpoint of the processing rate.

SUMMARY OF THE INVENTION

This invention provides a type of sorting device for a variable-length code containing the following parts: a coding part that converts the length value to a first bit column according to its value, a first shifter that converts the first bit column input from the aforementioned coding part to a second bit column according to the shift parameters, a second shifter that converts the code value to a third bit column according to the shift parameter, and a register that has the second bit column input from the aforementioned first shifter and the third bit column input from the aforementioned second shifter, and which outputs only the content of the bit at the position of the third bit column corresponding to the position of the bit indicating the prescribed value of the second bit column.

BRIEF DESCRIPTION OF THE DRAWINGS

FIG. 1 is a block diagram illustrating the prior art.

FIG. 2 is a diagram illustrating sorting of the variable-length code.

FIG. 3 is a diagram illustrating sorting of the variable-length code.

FIG. 4 is a block diagram illustrating the device for sorting of the variable-length code in an application example of this invention.

FIG. 5 is a diagram illustrating the operation in barrel shifter 44.

FIG. 6 is a diagram illustrating the operation in barrel shifter 42.

REFERENCE NUMERALS AS SHOWN IN THE DRAWINGS

Figure 7A:
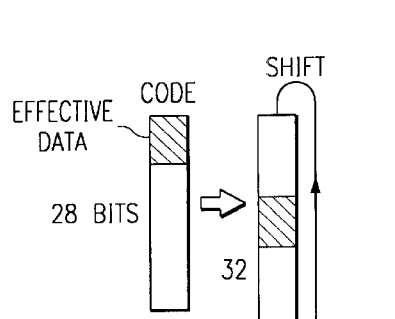
FIG. 7 is a diagram illustrating the write operation in barrel shifter 45.
Figure 7B:
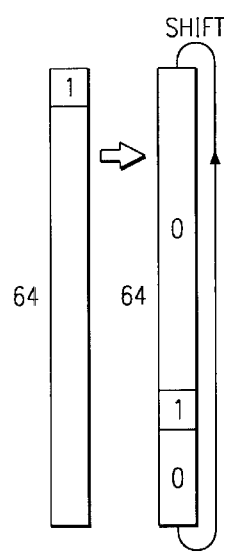
Figure 7C:
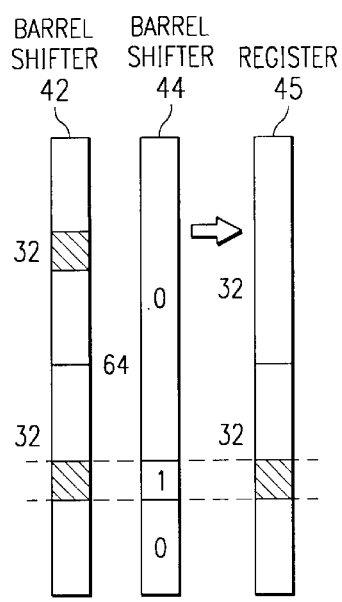
Figure 7D:
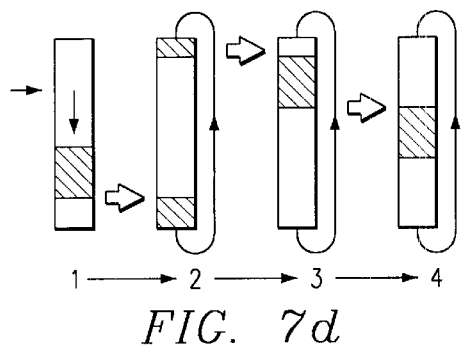

In the figures, 41 represents an adder, 42 represents a barrel shifter, 43 represents a priority coder, 44 represents a register, 45 represents a register, and 46 represents a multiplexer.

DESCRIPTION OF THE EMBODIMENTS

In the following, this invention will be explained in more detail with reference to an application example illustrated by figures.

FIG. 4 is a block diagram illustrating a sorting device of a variable-length code in an application example of this invention. The "length" is input to adder 41 and priority coder 43. Priority coder 43 sets the bits from the MSB side corresponding to the input length value to "1," then performs the output of 32 bits. For example, when the value of the length is "3," the bits from the MSB to bit 3 are set to "1," to perform 32 bits of "1110 . . . 0". As shown in FIG. 5, for barrel shifter 44, the 32-bit "0" input as one input is added to the 32-bit input from the priority coder; the input value is circulated and shifted in the barrel shifter using the 6-bit shift select inputs from adder 41, and its value is output.

As shown in FIG. 6, for barrel shifter 42, the value of the 28 bit input code is shifted into the 32 bit barrel shifter and output after shifting a value indicated by the lower 5 bits of the output of adder 41. The outputs of barrel shifters 44 and 42 are input to two registers 45A and 45B. However, as to be explained later, only the input bit portion from barrel shifter 42 corresponding to the bits that show "1" among the upper or lower 32 bits from barrel shifter 44 that have been input are written into register 45. Among the two registers 45A and 45B, the register that has become full becomes the output of multiplexer 46. It is possible to synchronized the output of multiplexer 46 using the transition low to high or from high to low of the MSB output from adder 41.

The operation involving extraction of the necessary portion from the "code" is explained using FIG. 7. The code (28 bits) input to barrel shifter 42 contains an effective bit column and a meaningless bit column. The 28 bits are shifted by a value indicating the lower 5 bits of the output of adder 41 (FIG. 7(a)). The input value (MSB) from adder (41) (FIG. 7(b)) is used only to shift the 64 bits input to barrel shifter 44. Thus the full 6 bits are used to shift the 64 bit barrel shifter and the 5 LSB bits are used to shift the 32 bit barrel shifter 42. In barrel shifter 44, the prescribed value, that is, only the portion of barrel shifter 42 corresponding to the prescribed value in barrel shifter 44, that is, the position of the bit indicating "1," is written in register 45 (FIG. 7(c)). Register 45 acquires the structure of a ring buffer by the output of barrel shifters 44 and 42 (FIG. 7(d)).

In the aforementioned application example, adder 41, barrel shifter 42, and priority coder 43 can perform processing while the same parallel number as the input signal is maintained. Consequently, there is no need to have the input-stage buffer as FIFO 1 as would be needed in the prior art. Also, for barrel shifter 42, barrel shifter 44, and register 55, since it is possible to perform parallel processing, it is possible to perform the operation at the same frequency as that of the input signal.

Figure 8:
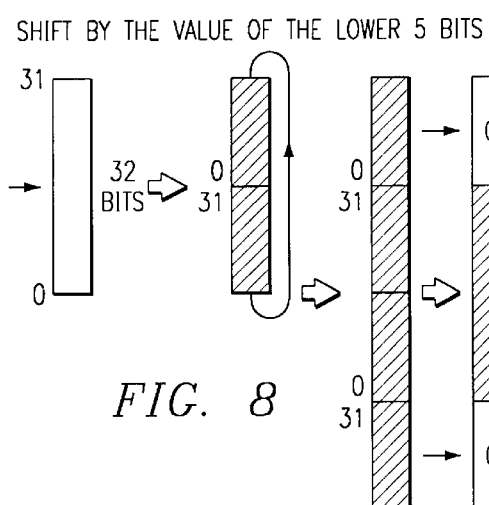
FIG. 8 is a diagram illustrating the method for reducing the size of barrel shifter 44.
Figure 9:
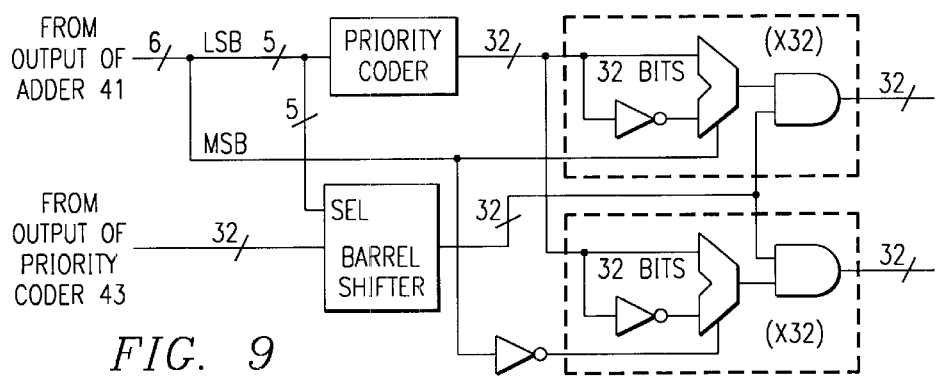
FIG. 9 is a block diagram illustrating the circuit for realizing the method illustrated in FIG. 8.

In the following, the method for reducing the size of barrel shifter 44 will be explained with reference to FIG. 8. As shown in FIG. 5, the lower 32 bits of barrel shifter (44) are fixed at "0." Consequently, the 32 bits input from priority coder 43 are shifted by the value of the lower 5 bits of the output of adder 41. Two shift results are set side by side, with the upper 16 bits and the lower 16 bits shifted from each other. In this way, it is possible to obtain the same shift result as that shown in FIG. 5. FIG. 9 illustrates the circuit for realizing this operation. This circuit has an area about ⅔ that when said 64-bit shift register 44 is used.

In the above, this invention was explained with reference to an application example. However, this invention is not limited to such application example.

In this invention, it is possible to perform the processing while the same parallel number as the input signal is maintained. Consequently, the input-stage buffer, such as FIFO 1, as would be needed in the conventional case is not needed. Also, sorting of the variable-length code can be carried out at the same frequency.

What is claimed is:

1. A sorting device for a variable-length code for sorting a number of input codes and code lengths associated with each input code comprising:
    a priority coding part that outputs a first bit column having a number of bits set to "1" equal to the length of the input code to make a mask,
    a first shifter that converts the first bit column input from the coding part to a second bit column according to shift parameters,
    a second shifter that converts the codes to a third bit column according to the shift parameters,
    and a register that has the second bit column input from the first shifter and the third bit column input from the second shifter, and where the register inputs the contents of the third bit column on a bit by bit basis for each bit having a corresponding bit set to a "1" of the second bit column.

2. The sorting device of claim 1 wherein the shift parameter is determined by an adder which adds the length value of an input code with the length value of the previous input code.

3. A sorting device for a variable-length code for sorting a number of input codes and code lengths associated with each input code comprising:
    a priority coding part that outputs a first bit column having a number of bits set equal to "1" equal to the lengh of the input code to make a mask,
    an adder which adds the length value of an input code with the length value of the previous input code to output shift parameters,
    a first shifter circuit that converts the first bit column input from the coding part to a second bit column according to shift parameters,
    a second shifter circuit that converts the codes to a third bit column according to the shift parameters, and
    a register that has the second bit column input from the first shifter and the third bit column input from the a second shifter, wherein the register inputs the contents of the third bit column on a bit by bit basis for each bit having a corresponding bit set of the second bit column, and
    a multiplexor which selects a portion of the register to output a combined code word according to a most significant bit of the adder output.

4. The sorting device of claim 3 wherein the first shifter circuit further comprises:
    a barrel shifter having the same number of bits as the output of the coding part, and wherein the first shifter circuit outputs a number of bits two times the number of bits input from the coding part by setting the output bits of the barrel shifter in two sets side by side.

* * * * *